United States Patent [19]

Baldwin et al.

[11] 4,297,642
[45] Oct. 27, 1981

[54] OFFSET CORRECTION IN OPERATIONAL AMPLIFIERS

[75] Inventors: Gary L. Baldwin, Palo Alto; James L. McCreary, Los Gatos, both of Calif.

[73] Assignee: Bell Telephone Laboratories, Incorporated, Murray Hill, N.J.

[21] Appl. No.: 89,851

[22] Filed: Oct. 31, 1979

[51] Int. Cl.³ .............................................. H03F 1/00
[52] U.S. Cl. ..................................................... 330/9
[58] Field of Search .................... 330/9; 328/162, 165

[56] References Cited

U.S. PATENT DOCUMENTS

| | | | |
|---|---|---|---|
| 2,919,409 | 12/1959 | Williams | 330/9 |
| 3,139,590 | 6/1964 | Brown | 330/9 |
| 3,448,393 | 6/1969 | Rice | 330/9 |
| 3,617,913 | 11/1971 | Schmidhauser | 330/9 |
| 3,654,560 | 4/1972 | Cath et al. | 328/162 X |
| 3,667,055 | 5/1972 | Uchida | 330/9 X |
| 3,988,689 | 10/1976 | Ochi et al. | 330/9 |

OTHER PUBLICATIONS

*Electronics Review*, "C-MOS Op Amp Offsets Errors with Continuous Sampling Technique" Jan. 18, 1979, pp. 39–40.

*Primary Examiner*—James B. Mullins
*Attorney, Agent, or Firm*—Barry H. Freedman

[57] ABSTRACT

A circuit which includes an operational amplifier (101) and includes switches (104, 106) for cancelling offset buildup in the amplifier in response to a circuit (110) which detects zero crossings of the input signal. Where the frequency of the input is higher than the frequency at which cancellation is necessary, circuit (110) may respond only to the zero crossing next following each of a regularly occurring series of timing pulses.

8 Claims, 6 Drawing Figures

OFFSET CORRECTION IN OPERATIONAL AMPLIFIERS

TECHNICAL FIELD

The present invention relates to the correction of d.c. offset or drift in circuits utilizing operational amplifiers.

BACKGROUND OF THE INVENTION

When the input signal voltage to an ideal operational amplifier (op amp) is zero, the output voltage is also zero. However, this ideal state rarely exists, since real op amps suffer imperfections to circuit components which cause a voltage to exist at the output even with a zero input. This voltage is called the output offset voltage or drift voltage, and can be troublesome if not entirely eliminated or at least significantly reduced.

Offset correction can be achieved using a stabilization technique in which the output of the amplifier for a null input is first stored and then interconnected with the amplifier input so as to cancel any offset. It is noted, however, that the stored voltage usually decays between each interconnection cycle, so that the frequency and duty cycle of the switch which controls the interconnection must be appropriately chosen in light of the nature of the input signal being processed in the op amp, the amount of offset expected, the frequency characteristics of the amplifier and the amount of distortion that can be tolerated. The usefulness of this technique in eliminating offset also depends upon the particular op amp circuit application involved. Specifically, in situations in which the input to the op amp is a series of samples, the off time between samples can be used to correct or eliminate the offset voltage. This advantageously eliminates any problems associated with noise introduced during the interconnection operation. On the other hand, when the input to the amplifier is continuous, the discontinuity caused by switching can be a significant problem.

Offset correction of the type described above is illustrated in U.S. Pat. No. 3,448,393 issued to W. W. Rice, Jr., on June 3, 1969. As shown in FIG. 2, the offset voltage generated in amplifier 40 is stored in capacitor C48 when switch S50 is connected to contact 46 and the amplifier input is at ground potential. During the operating cycle, the switch is repositioned to connect the capacitor to the amplifier input 42 via contact 47 and resistor R49, effecting offset cancellation.

Another offset cancellation approach is disclosed in U.S. Pat. No. 3,988,689 issued to S. S. Ochi et al. on Oct. 26, 1976. This technique requires at least one supplementary amplifier 24 in addition to the primary op amp 10, 12, and at least one capacitor 26, which stores the offset voltage generated by the main amplifier during a short correction cycle. Thereafter, during the signal amplification (operating) cycle, the stored offset voltage is inverted, amplified and combined with the input to the amplifier, to effect cancellation. This approach, as shown in FIG. 4 of the patent, introduces a slight discontinuity into the output, which like the Rice technique, adds undesirably to the noise in the output. The discontinuity or noise can be reduced (but not totally elminated) using the refinement illustrated in FIG. 7 of the Ochi patent. In this circuit, a pair of capacitors 68 and 26 at the input of the correcting amplifier 24 are used to store the operating output voltage of the amplifier and the offset voltage, respectively. The offset is added to the operating voltage, inverted and applied, as before, to cancel the offset. The noise reduction achieved by this arrangement is graphically illustrated by comparison of FIGS. 4 and 6 in the Ochi patent.

Another offset correction technique which also requires two amplifiers is described in an article entitled "C-MOS Op Amp Offset Errors With Continuous Sampling Technique" published in *Electronics*, Jan. 18, 1979, p. 39. The first op amp is used to process the input signal while the offset voltage from the second op amp is stored on a capacitor. Then, the input is applied to the second op amp in series with and cancelling the offset voltage stored on the capacitor, while the offset of the first op amp is stored on a second capacitor. This provides autozeroing of the amplifier at all times, again except for a momentary switchover mode.

While the Ochi and continuous sampling techniques result in elimination of some of the noise associated with the discontinuities generated during offset correction, both require the use of at least one supplementary amplifier, adding to the cost of the circuits. Furthermore, during the offset correction cycle, a momentary switchover mode still exists, so that all noise is not eliminated.

In view of the foregoing, the broad object of the present invention is to reduce or remove offset errors in operational amplifiers without adding significant noise due to switching discontinuities. The technique desirably avoids the need for an additional amplifier, and should be easily implemented.

SUMMARY OF THE INVENTION

In accordance with the present invention, means are provided at the amplifier input to detect zero crossings of the input signal, and offset correction is allowed to occur only at the zero crossings, thereby substantially eliminating any switching discontinuity. In this way, the offset correction occurs on an aperiodic basis, under control of the input signal itself. Where the frequency of the input signal is higher than the frequency needed to periodically cancel the offset voltage, means for permitting offset correction only at the zero crossing nextoccuring after a clock signal may be provided.

BRIEF DESCRIPTION OF THE DRAWING

The present invention will be better appreciated by reading of the following detailed description taken together with the accompanying drawing, in which.

DETAILED DESCRIPTION

Figure 1:
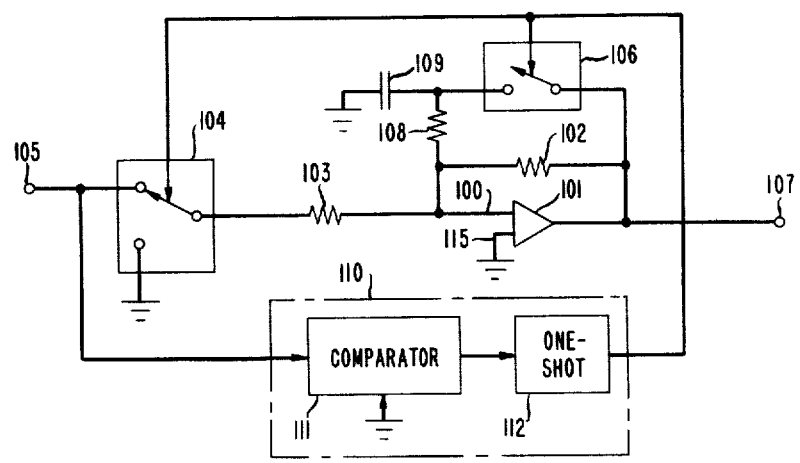
FIG. 1 is a block diagram of an operational amplifier circuit which includes means for eliminating offset error.

In FIG. 1, an operational amplifier circuit includes amplifier 101, a feedback resistor 102 connected between the amplifier output 107 and its input 100, and an input resistor 103, in series with input 100. A first switch 104 is disposed in the input line between the circuit input 105 and resistor 103, and a second switch 106 is connected between output 107 and the junction between a capacitor 109 and a resistor 108. The remaining terminal of resistor 108, which has a resistance equal to that of resistor 103, is connected to input 100, while the remaining terminal of capacitor 109 is connected to the same reference potential (e.g., ground) as the second input 104 is grounded, the offset voltage output from amplifier 100 is stored on capacitor 109. When switch 106 is opened, the voltage stored on capacitor 109 is connected to input 100 via resistor 108, and the amplifier offset is thus cancelled. In accordance with the invention, switching control means 110 is arranged to respond to zero crossings in the signal at input 105, and to close switch 106 and open switch 104 in unison. Control means 110 includes a comparator 111 which compares the input signal to the reference (ground) potential, and a one shot circuit 112 which is triggered by the comparator output at each zero crossing. The width $\tau$ of the output pulse from circuit 112 is selected to allow sufficient time for cancellation.

Figure 2:
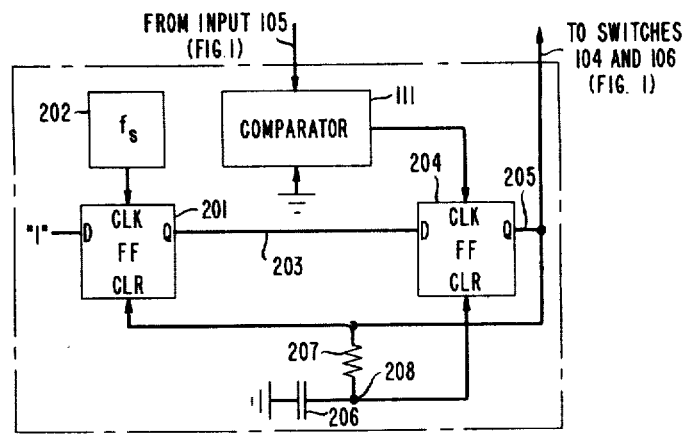
FIG. 2 is a block diagram of offset cancelling means which responds to each zero crossing subsequent to a timing pulse.

If the frequency of the input signal is significantly higher than the rate at which offset cancellation is necessary or desirable, the arrangement of FIG. 2 may be used to implement switching control means 110. Here, a flip-flop 201 receives pulses at its clock input from a stabilizer clock 202 operated at a desired cancellation frequency $f_S$. At each clock pulse, the output 203 of flip-flop 201 is high, thereby enabling the data input of a second flip-flop 204. Thus, when the output of comparator 111 next goes high (indicating a zero crossing in the input signal), the output 205 of flip-flop 204 goes high, controlling switches 104 and 106 and correcting the offset voltage.

The output of flip-flop 205 is also used to immediately reset flip-flop 201 and to charge a capacitor 206 via resistor 207. When the voltage at the node 208 reaches a predetermined level, flip-flop 204 is also reset, with the circuit again ready to respond to the next pulse output from clock 202. The time constant of resistor/capacitor 207, 206 is chosen so as to keep switch 106 closed and switch 103 open for the time periof $\tau$ which is long enough to cancel the offset buildup.

Figure 3:
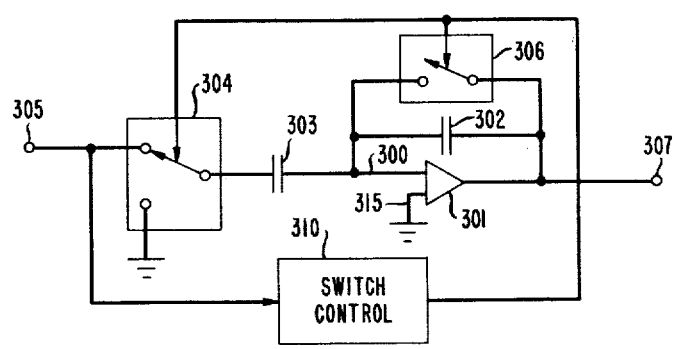
FIG. 3 is a block diagram of an op amp circuit arranged as an attenuator which incorporates the present invention.

The present invention can also be used with an operational amplifier acting as an attenuator, as illustrated in FIG. 3. Here, a feedback capacitor 302 connects the output 307 of an op amp 301 with its input 300, and an input capacitor 303 is connected in series with amplifier input 300 and the attenuator input 305. A first switch 304 is serially disposed between input 305 and capacitor 303, and a second switch 306 is disposed across capacitor 302. In this circuit, the storage required for offset cancellation is inherently available in the input capacitor 303.

When switch 306 is closed and switch 304 is repositioned so as to connect the input side of capacitor 303 to the same reference potential applied to amplifier input 315, the offset voltage output from amplifier 301 is stored on capacitor 303. During the next operating cycle, switch 306 is opened and switch 304 returned to the closed position shown in FIG. 3. The stored voltage on capacitor 303 now cancels the offset, as desired. During this cycle, the attenuation of the circuit is determined by capacitance ratio of capacitors 303 and 302. In accordance with the present invention, the operation of switches 304 and 306 is controlled by a switch control circuit 310, which may be identical to circuit 110 of FIG. 1 or the circuit shown in FIG. 2. In the former event, offset correction occurs at each zero crossing of the input signal, while in the latter case, the zero crossing next following each clock pulse in a series of pulses generated at a predetermined rate triggers switch actuation.

The improvement brought about by the present invention can be estimated by comparing the noise generated with an without zero crossing detection. For the case where the offset is cancelled using a periodic pulse of width $\tau$ and period $T_s$, the amplifier output can be represented (for short intervals) as a sinusoid $\cos \omega_o \tau$ multiplied by the natural sampling function $$s(t) = \frac{\tau}{T_s}\left[1 + 2 \sum_{n=1}^{\infty} (-1)^{n+1} \frac{\Delta}{\tau} \operatorname{sinc} \frac{n\pi\Delta}{T_s} \cos \frac{2\pi n t}{T_s}\right] \quad (1)$$

where $\omega_o$ is the frequency of the amplifier input and $T_s = \tau + \Delta$ and $\Delta << \tau$. The output of the amplifier is thus given by:

$$s(t) \cos \omega_o t = \quad (2)$$

$$\frac{\tau}{T_s} \cos \omega_o t \left[1 + 2 \sum_{n=1}^{\infty} (-1)^{n+1} \frac{\Delta}{\tau} \operatorname{sinc} \frac{n\pi\Delta}{T_s} \cos \frac{2\pi n t}{T_s}\right]$$

Figure 4:
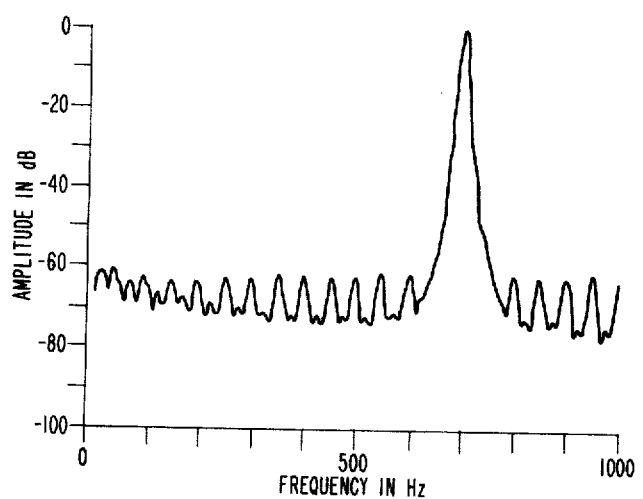
FIG. 4 illustrates the noise spectrum associated with offset correction without the present invention.

From equation (2), it is seen that the amplifier output contains harmonics of $\omega_s = 2\pi/T_s$ of nearly uniform amplitude in and around the frequency range dc to $\omega_o/2\pi$ (typically 30–3000 Hz), since sinc $n\pi\Delta/T_s \approx 1$ for very small $\Delta/T_s$. This result was confirmed experimentally for the attenuator of FIG. 3 and a typical output spectrum is shown in FIG. 4.

Figure 5:
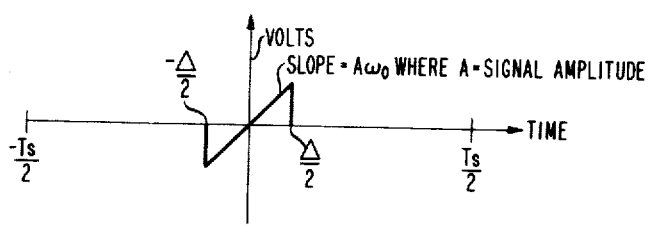
FIG. 5 illustrates the contribution to the output waveform of an amplifier circuit that results from using the present invention for offset cancellation.

When zero crossing detection as in FIG. 2 is used in the op amp attenuator of FIG. 3, noise analysis is more difficult due to the correlation between the input frequency and the offset correction. The component of the amplifier output due to correction can be approximated by a ramp of slope $A \omega_o$ and width $\Delta$, as shown in FIG. 5, where A (assumed to be unity) is the signal amplitude and $\omega_o$ is the frequency of the input. The dc term and all even harmonics from the noise are thus lost, and the output $V_{out}$ may be represented as $$V_{out} = \sum_{n=1}^{\infty} b_n \sin n\omega_s t \quad (3)$$

where $$b_n = \frac{2}{T_s} \int_{-\frac{\Delta}{2}}^{+\frac{\Delta}{2}} \omega_o t \sin n\omega_s t \, dt \quad (4)$$

Expanding equation (4) and using $T_s/2 = \pi/\omega_s = K t_o$ where K is the integral number of periods of the input signal contained in one period $T_s$ of the sampling function, $V_{out}$ becomes $$V_{out} = \frac{\Delta \omega_s}{2K} \sum_{n=1}^{\infty} \frac{1}{n} \left[\sin \frac{n\omega_s \Delta}{2} - \cos \frac{n\omega_s \Delta}{2}\right] \sin \omega_s n t \quad (5)$$

Figure 6:
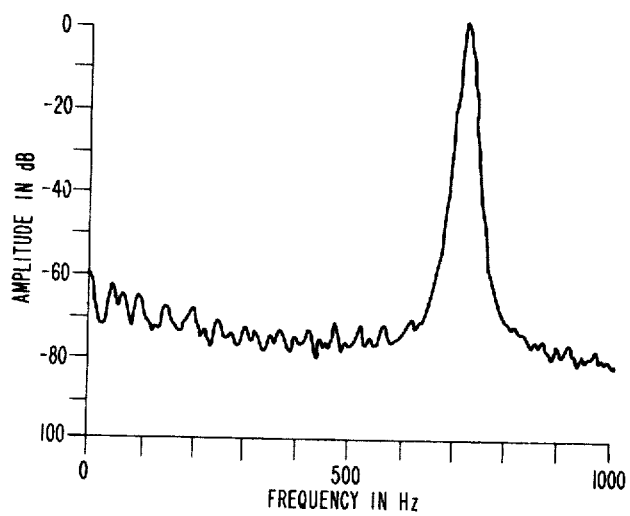
FIG. 6 illustrates the noise spectrum (similar to FIG. 4) when zero crossing detection in accordance with the present invention is used in offset correction.

For the lowest harmonics of the sampling function, the bracketed term in equation (5) is nearly zero. Higher coefficients are attenuated by the $1/n$ term, again keeping noise low. This improvement is illustrated in FIG. 6, which shows a typical output spectrum.

It should be noted that the foregoing analysis omits the noise term, in the form of a ramp, associated with slow dc drift at the output of the amplifier. This term, however, is the same with or without zero crossing detection.

Various modifications and adaptations of the present invention will be readily apparent to those skilled in the art. For this reason, it is intended that the invention be limited only by the appended claims.

What is claimed is:

1. Apparatus including an operational amplifier (101) which is adapted to receive an input signal, said apparatus comprising:

means (104, 106) connected with the output of said operational amplifier and operable to cancel d.c. offset in said amplifier, CHARACTERIZED BY means (110) for operating said cancelling means in response to zero crossings in said input signal.

2. The invention defined in claim 1 wherein said cancelling means includes means (109 or 303) for storing the output of said amplifier when the input thereto is zero.

3. The invention defined in claim 2 wherein said cancelling means is arranged to periodically apply said stored output to the input of said amplifier.

4. The invention defined in claim 1 wherein said apparatus includes a source (202) of clock pulses, and said operating means (110) is arranged to actuate said cancelling means at the zero crossing next following each of said clock pulses.

5. Apparatus for cancelling offset in an operational amplifier circuit including switch means for (a) interconnecting the output of said amplifier with a storage element while concurrently connecting the input to said amplifier to zero, and (b) connecting said storage element to said amplifier input, and means for operating said switch means in response to zero crossings of the signal applied to said amplifier input.

6. The invention defined in claim 5 wherein said operating means comprises a source of regularly occurring timing pulses and circuit means responsive to the zero crossing next following each timing pulse.

7. A method of cancelling offset in an operational amplifier circuit, including the steps of:

storing the output of said amplifier and thereafter connecting said stored output to the input of said amplifier, wherein said method is CHARACTERIZED BY controlling the times of occurrence of said storing step as a function of zero crossings in the signal applied to said amplifier input.

8. The method of claim 7 wherein said controlling step includes selecting only those zero crossings next following each output from a source of clock pulses.

* * * * *